United States Patent
Wang et al.

(10) Patent No.: US 12,154,990 B2
(45) Date of Patent: Nov. 26, 2024

(54) GaN/TWO-DIMENSIONAL AlN HETEROJUNCTION RECTIFIER ON SILICON SUBSTRATE AND PREPARATION METHOD THEREFOR

(71) Applicant: SOUTH CHINA UNIVERSITY OF TECHNOLOGY, Guangzhou (CN)

(72) Inventors: Wenliang Wang, Guangzhou (CN); Guoqiang Li, Guangzhou (CN); Yuhui Yang, Guangzhou (CN); Deqi Kong, Guangzhou (CN); Zhiheng Xing, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 378 days.

(21) Appl. No.: 17/789,789

(22) PCT Filed: Jul. 7, 2020

(86) PCT No.: PCT/CN2020/100510
§ 371 (c)(1),
(2) Date: Jun. 29, 2022

(87) PCT Pub. No.: WO2021/217875
PCT Pub. Date: Nov. 4, 2021

(65) Prior Publication Data
US 2023/0030977 A1 Feb. 2, 2023

(30) Foreign Application Priority Data

Apr. 27, 2020 (CN) .......................... 202010346191.2

(51) Int. Cl.
*H01L 29/872* (2006.01)
*H01L 21/02* (2006.01)
(Continued)

(52) U.S. Cl.
CPC ...... *H01L 29/872* (2013.01); *H01L 21/02057* (2013.01); *H01L 21/0217* (2013.01);
(Continued)

(58) Field of Classification Search
CPC ..... H01L 29/201–205; H01L 29/66219; H01L 21/0435; H01L 21/0495; H01L 29/47–475
See application file for complete search history.

(56) References Cited

U.S. PATENT DOCUMENTS

2013/0240911 A1    9/2013   Beach

FOREIGN PATENT DOCUMENTS

CN         1957474         5/2007
CN        204067372       12/2014
(Continued)

OTHER PUBLICATIONS

"International Search Report (Form PCT/ISA/210) of PCT/CN2020/100510", mailed on Jan. 27, 2021, with English translation thereof, pp. 1-4.
(Continued)

Primary Examiner — Amar Movva
(74) Attorney, Agent, or Firm — JCIPRNET (57) ABSTRACT

The present invention provides a GaN/two-dimensional AlN heterojunction rectifier on a silicon substrate and a preparation method therefor and belongs to the field of rectifiers. The rectifier comprises a silicon substrate, a GaN buffer layer, a carbon-doped semi-insulating GaN layer, a two-dimensional AlN layer, a non-doped GaN layer, a non-doped InGaN layer and a $SiN_x$ passivation layer that are stacked in sequence. The rectifier further comprises a mesa isolation groove and a Schottky contact electrode that are arranged at one side. The mesa isolation groove is in contact with the non-doped GaN layer, the non-doped InGaN layer, the $SiN_x$ passivation layer and the Schottky contact electrode. The
(Continued)

Schottky contact electrode is in contact with the mesa isolation groove and the non-doped GaN layer. The thickness of the two-dimensional AlN layer is only several atomic layers, thus the received stress and polarization intensity are greater than those of the AlGaN layer.

18 Claims, 2 Drawing Sheets

(51) Int. Cl.
| | |
|---|---|
| H01L 21/285 | (2006.01) |
| H01L 21/311 | (2006.01) |
| H01L 21/3213 | (2006.01) |
| H01L 23/29 | (2006.01) |
| H01L 23/31 | (2006.01) |
| H01L 29/20 | (2006.01) |
| H01L 29/205 | (2006.01) |
| H01L 29/47 | (2006.01) |
| H01L 29/66 | (2006.01) |

(52) U.S. Cl.
CPC .. *H01L 21/02274* (2013.01); *H01L 21/02381* (2013.01); *H01L 21/02458* (2013.01); *H01L 21/0254* (2013.01); *H01L 21/02631* (2013.01); *H01L 21/28581* (2013.01); *H01L 21/31111* (2013.01); *H01L 21/32136* (2013.01); *H01L 23/291* (2013.01); *H01L 23/3171* (2013.01); *H01L 29/2003* (2013.01); *H01L 29/205* (2013.01); *H01L 29/475* (2013.01); *H01L 29/66212* (2013.01); *H01L 29/66219* (2013.01)

(56) References Cited

FOREIGN PATENT DOCUMENTS

| | | |
|---|---|---|
| CN | 108010956 | 5/2018 |
| WO | 2013008414 | 1/2013 |

OTHER PUBLICATIONS

Milena Beshkova et al., "Properties and potential applications of two-dimensional AlN," Vacuum, vol. 176, Jan. 2020, pp. 1-17.

GaN/TWO-DIMENSIONAL AlN HETEROJUNCTION RECTIFIER ON SILICON SUBSTRATE AND PREPARATION METHOD THEREFOR

CROSS-REFERENCE TO RELATED APPLICATION

This application is a 371 of international application of PCT application serial no. PCT/CN2020/100510, filed on Jul. 7, 2020, which claims the priority benefit of China application no. 202010346191.2, filed on Apr. 27, 2020. The entirety of each of the above mentioned patent applications is hereby incorporated by reference herein and made a part of this specification.

TECHNICAL FIELD

The present invention relates to the field of rectifiers, and particularly relates a GaN/two-dimensional MN heterojunction rectifier on a silicon substrate and a preparation method therefor.

BACKGROUND

Spatial wireless energy transmission technologies are a quite active research hotspot in recent years, featuring high environmental affinity, green environmental protection and safe transmission that do not belong to a contact energy transmission mode. Rectifiers, as an indispensible part of a spatial wireless energy transmission system, are widely applied in the military and civilian fields of satellite systems, aerospace aircrafts, household appliances and the like. At present, most rectifiers are first generation semiconductors Si. However, Si is an indirect band gap semiconductor featuring small forbidden bandwidth and low breakdown field strength, so that it is difficult to apply Si to high-frequency devices. III-nitrides on behalf of third generation semiconductors feature high breakdown voltage, large forbidden bandwidth, high thermal conductivity, high electron saturation rate, high carrier mobility and the like, so that they have a huge potential in preparing rectifiers. Most rectifiers prepared based on the III-nitrides at present are of AlGaN/GaN heterostructures. Two-dimensional electron gases with high areal density and electron mobility will be generated at an interface due to the polarization effect of the AlGaN/GaN heterojunction, so that preparation of radio frequency devices with theoretic frequency reaching THz can be realized. Whereas the polarization intensity of the AlGaN/GaN heterojunction is hardly regulated and controlled, the AlGaN layer is extremely thick to lead to relaxation and extremely thin to reduce its quality and uniformity, so that it is difficult to meet the application requirements of a new generation microwave radio frequency system in high frequency and high efficiency. Therefore, the point to realize a high-frequency and high-efficiency rectifier device is to design a novel heteroepitaxial structure with higher polarization intensity. The thickness of the two-dimensional AlN is only several atomic layers, thus the received stress and polarization intensity are greater than those of the AlGaN layer. Therefore, a heterostructure of GaN/two-dimensional AlN is capable of generating a two-dimensional electron gas with an ultra-high concentration and ultra-high mobility, thereby greatly improving the frequency and efficiency.

SUMMARY

Technical Problem

Technical Solution for the Technical Problem

Technical Solution

In order to overcome the above-mentioned defects and shortcomings in the prior art, the present invention is intended to provide a GaN/two-dimensional AlN heterojunction rectifier on a silicon substrate and a preparation method therefor. The method has the advantages of being high in matching attribute with existing production means and easy to be realized.

The objective of the present invention is realized by one of the technical solutions as follows:

A GaN/two-dimensional MN heterojunction rectifier on a silicon substrate includes a silicon substrate, a GaN buffer layer, a carbon-doped semi-insulating GaN layer, a two-dimensional MN layer, a non-doped GaN layer, a non-doped InGaN layer and a $SiN_x$ passivation layer that are stacked in sequence, and further comprising a mesa isolation groove and a Schottky contact electrode that are arranged at one side of the non-doped InGaN layer, wherein the mesa isolation groove is in contact with the non-doped GaN layer, the non-doped InGaN layer, the $SiN_x$ passivation layer and the Schottky contact electrode, and the Schottky contact electrode is in contact with the mesa isolation groove and the non-doped GaN layer.

As a preferred embodiment of the present invention, a thickness of the GaN buffer layer is 650-900 nm.

As a preferred embodiment of the present invention, a doping concentration of the carbon-doped semi-insulating GaN layer is $5.0 \times 10^{18}$ to $6.0 \times 10^{18}$ cm$^{-3}$, and a thickness of the carbon-doped semi-insulating GaN layer is 80 to 180 nm.

As a preferred embodiment of the present invention, a thickness of the two-dimensional MN layer is 2 to 4 atomic layers.

As a preferred embodiment of the present invention, the thickness of the two-dimensional MN layer is 2 atomic layers.

As a preferred embodiment of the present invention, a thickness of the non-doped GaN layer is 350 to 550 nm.

As a preferred embodiment of the present invention, a thickness of the InGaN layer is 50 to 200 nm.

As a preferred embodiment of the present invention, x in the $SiN_x$ passivation layer is equal to 1.29 to 1.51.

As a preferred embodiment of the present invention, a depth of the mesa isolation groove (8) is 1.2 to 1.5 µm, and a thickness of the Schottky contact electrode (9) is 220 to 250 nm.

As a preferred embodiment of the present invention, the depth of the mesa isolation groove is 1.5 µm, and the thickness of the Schottky contact electrode is 250 nm.

A method for preparing a GaN/two-dimensional MN heterojunction rectifier on a silicon substrate according to any one embodiment above includes the following steps:

(1) growing a GaN buffer layer, a carbon-doped semi-insulating GaN layer, a two-dimensional MN layer, a non-doped GaN layer and a non-doped InGaN layer on a silicon substrate in sequence to obtain an epitaxial wafer of the rectifier;

(2) putting the epitaxial wafer of the rectifier obtained in the step (1) in acetone and anhydrous ethanol in sequence for ultrasonic treatment, taking the epitaxial wafer of the rectifier out, cleaning the epitaxial wafer of the rectifier with deionized water, and then blow-drying the epitaxial wafer of the rectifier with nitrogen;

(3) transferring a Schottky contact electrode pattern to the epitaxial wafer of the rectifier: evenly spin-coating a photoresist to the epitaxial wafer of the rectifier obtained in the step (2), then putting the epitaxial wafer of the rectifier in a lithography machine to be exposed, and finally cleaning the epitaxial wafer with a developing solution to reveal the pattern;

(4) etching a groove along a Schottky contact electrode pattern in the epitaxial wafer of the rectifier by utilizing a reactive ion etching method to obtain an ohmic contact electrode;

(5) preparing a Schottky contact electrode: putting the epitaxial wafer of the rectifier etched with the groove with the ohmic contact electrode pattern obtained in the step (4) in an electron beam evaporation apparatus, then vacuumizing a cavity, bombarding a metal target with an electronic gun so as to deposit a metal to a surface of the epitaxial wafer, and after evaporation, annealing the epitaxial wafer;

(6) immersing the epitaxial wafer of the rectifier into a stripping liquid for photoresist and cleaning the epitaxial wafer of the rectifier with deionized water, then putting the epitaxial wafer of the rectifier in acetone for ultrasonic treatment, and blow-drying the epitaxial wafer of the rectifier with nitrogen;

(7) aligning the epitaxial wafer of the rectifier with an alignment mark in a mask, repeating the step (3), performing lithography development in a corresponding position to prepare the ohmic contact electrode pattern and cleaning the pattern;

(8) preparing an ohmic contact electrode: repeating the steps (5) and (6), depositing an electrode metal, and performing annealing and cleaning to complete preparation of the ohmic contact electrode;

(9) preparing a silicon nitride passivation layer: putting the epitaxial wafer of the rectifier obtained in the step (8) in a plasma enhanced chemical vapor deposition apparatus, then raising the temperature, performing vacuumizing and introducing a carrier gas and a reaction gas in sequence, and finally depositing the $SiN_x$ passivation layer on the surface of the epitaxial wafer;

(10) repeating the step (3) to perform exposure and development at the ohmic contact electrode and the Schottky contact electrode so as to expose $SiN_x$ on the two electrodes;

(11) etching the exposed $SiN_x$ by using a wet etching method, and finally repeating the step (6) to remove residual photoresist and $SiN_x$ passivation layer on the surface of the epitaxial wafer of the rectifier;

(12) aligning by the alignment mark of the mask, and repeating the steps (3) and (4) so as to transfer a mesa isolation pattern to the surface of the epitaxial wafer and etch the groove in the surface;

(13) putting the epitaxial wafer of the rectifier obtained in the step (12) in a plasma-assisted chemical vapor deposition apparatus, repeating the step (8), and depositing the $SiN_x$ passivation layer in the groove etched in the step (12); and (14) after repeating the step (11) to remove the residual photoresist on the surface of the epitaxial wafer, removing the residual photoresist and $SiN_x$ on the surface of the epitaxial wafer of the rectifier by means of immersion in the stripping liquid for photoresis and ultrasonic cleaning so as to complete preparation of the GaN/two-dimensional MN heterojunction rectifier on a silicon substrate.

Beneficial Effects of the Present Invention

Beneficial Effects

Compared with the prior art, the present invention has the following beneficial effects:

(1) a two-dimensional AlN/GaN film heterostructure provided by the present invention is capable of generating a two-dimensional electron gas with an ultra-high concentration and ultra-high mobility, thereby greatly improving the frequency and efficiency. The electron gas concentration of the rectifier prepared in the embodiment 1 reaches up to $10^{14}$ $cm^{-2}$, and the electron mobility reaches up to 3000 $cm^2$/Vs.

(2) A material film of the present invention features small defect concentration. The full width half maximum of a GaN (0002) x-ray swing curve of the GaN film in the embodiment 1 is 0.09°.

(3) The rectifier provided by the present invention is good in stability and reliability. The threshold voltage in the embodiment 1 is 0.75V, and the calculated specific on-resistance $R_{ON}$ is 8.8 mΩ/sq.

(4) The rectifier provided by the present invention is good in reverse leakage performance. Under a reverse bias of −20V, the measured leak current of the rectifier prepared in the embodiment 1 is −0.0003 A.

INVENTION EMBODIMENTS

Embodiments of the Present Invention

Further description of specific embodiments of the present invention in detail will be made below in combination with the embodiments and the accompanying drawings, but implementations of the present invention are not limited thereto.

Figure 1:
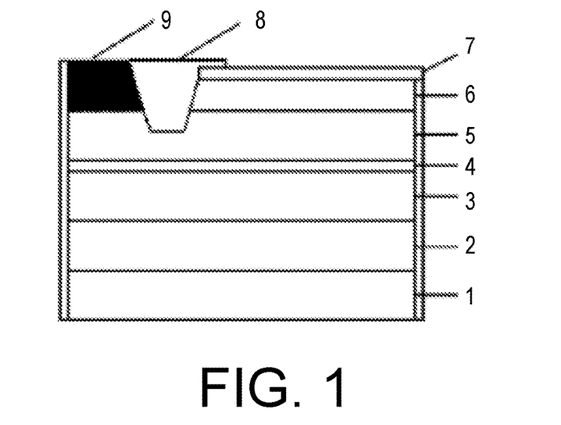
FIG. 1 is a schematic cross section of a chip of a rectifier prepared in an embodiment 1 of the present invention.

The structure of the rectifier provided by the present invention is as shown in FIG. 1, including a silicon substrate 1, a GaN buffer layer 2, a carbon-doped semi-insulating GaN layer 3, a two-dimensional MN layer 4, a non-doped GaN layer 5, a non-doped InGaN layer 6 and a $SiN_x$ passivation layer 7 that are stacked in sequence, and further including a mesa isolation groove 8 and a Schottky contact electrode 9 that are arranged at one side of the non-doped InGaN layer 6, wherein the mesa isolation groove 8 is in contact with the non-doped GaN layer 5, the non-doped InGaN layer 6, the $SiN_x$ passivation layer 7 and the Schottky contact electrode 9, and the Schottky contact electrode 9 is in contact with the mesa isolation groove 8 and the non-doped GaN layer 5.

Embodiment 1

A method for preparing a chip of a rectifier on a silicon substrate suitable for working at an alternating current frequency includes:

(1) an epitaxial wafer of a rectifier is grown on a silicon substrate by adopting a low-temperature pulsed laser deposition technology, the epitaxial wafer including a GaN buffer layer 2 grown on the silicon substrate 1, a carbon-doped semi-insulating GaN layer 3 grown on the GaN buffer layer 2 with a doping concentration of $5.9 \times 10^{18}$ cm$^{-3}$, a non-doped two-dimensional AlN layer 4 grown on the carbon-doped semi-insulating GaN layer 3, a non-doped GaN layer 5 grown on the non-doped two-dimensional AlN layer 4 and a non-doped InGaN layer 6 grown on the non-doped GaN layer, wherein a thickness of the GaN buffer layer is 800 nm, a thickness of the carbon-doped semi-insulating GaN layer is 80 nm, a thickness of the non-doped two-dimensional AlN layer is 2 atomic layers, a thickness of the non-doped GaN layer is 450 nm, and a thickness of the non-doped InGaN layer is 120 nm;

(2) the epitaxial wafer of the rectifier is put in acetone and anhydrous ethanol in sequence for ultrasonic treatment for 5 min, the epitaxial wafer of the rectifier is taken out, the epitaxial wafer of the rectifier is cleaned with deionized water, and then the epitaxial wafer of the rectifier is blow-dried with nitrogen;

(3) the cleaned epitaxial wafer of the rectifier is spin-coated with a positive photoresist with a model of AZ5214 and a thickness of 0.3 μm; the epitaxial wafer coated with the photoresist is placed on a heating stage to be pre-dried for 45 s, then it is put in a lithography machine to be exposed for 5 s, then the exposed epitaxial wafer is immersed into a developing solution with a model of RZX3038 for 60 s, so that a pattern on the epitaxial wafer emerged, and the epitaxial wafer is cleaned with deionized water and blow-dried with nitrogen; and finally, the epitaxial wafer is placed on the heating stage to be hard baked for 45 s;

(4) a groove is etched along the Schottky contact electrode pattern in the epitaxial wafer of the rectifier by utilizing a reactive ion etching method, a depth of the groove being 250 nm;

(5) the epitaxial wafer of the rectifier etched with the groove with the ohmic contact electrode pattern obtained in the step (4) is put in an electron beam evaporation apparatus, a cavity is vacuumized to $2 \times 10^{-5}$ Pa, and then electrode metals MoS$_2$/Ni/Au are evaporated in sequence; and after evaporation, the epitaxial wafer of the rectifier is annealed at 400° C. for 55 min;

(6) the epitaxial wafer of the rectifier with the ohmic contact electrode is immersed into a stripping liquid for photoresist for 70 min, the epitaxial wafer of the rectifier is cleaned with deionized water after being fished out, then the epitaxial wafer of the rectifier is put in acetone for ultrasonic treatment for 5 min, and the epitaxial wafer of the rectifier is taken out, cleaned with deionized water and blow-dried with nitrogen;

(7) the epitaxial wafer of the rectifier is aligned with an alignment mark in a mask, the step (3) is repeated, and lithography development is performed in a corresponding position to prepare an area with the exposed Schottky contact electrode pattern on the epitaxial wafer of the rectifier;

(8) the ohmic contact electrode 9 is prepared for the photoetched epitaxial wafer of the rectifier: the epitaxial wafer of the rectifier with the ohmic contact electrode pattern is put in an electron beam evaporation apparatus, a cavity is vacuumized to $2 \times 10^{-5}$ Pa, and then ohmic contact electrode substances Ti/Al/Ni/Au are evaporated in sequence; and finally the step (6) is repeated to remove residual photoresist and evaporation metals on the surface of the epitaxial wafer;

(9) a SiN$_x$ passivation layer 7 is prepared by using a plasma-enhanced chemical vapor deposition method: the epitaxial wafer of the rectifier with the prepared electrode is put in a plasma-enhanced chemical vapor deposition apparatus, the apparatus is heated to 800° C., and a cavity is vacuumized to $2 \times 10^{-5}$ Pa, a deposition time being 75 min;

(10) the step (3) is repeated, a mask is prepared on the surface of the epitaxial wafer by means of lithography development, and SiN$_x$ (x=1.33 to 1.5) on the ohmic contact electrode and the Schottky contact electrode pattern is exposed;

(11) the exposed SiN$_x$ passivation layer is etched by using a wet etching method, is taken out and is cleaned with deionized water, and finally the step (6) is repeated to remove residual photoresist and SiN$_x$ on the surface of the epitaxial wafer of the rectifier by means of immersion in the stripping liquid for photoresist and ultrasonic cleaning;

(12) aligned by the alignment mark in the mask, and the steps (3) and (4) are repeated to perform lithography development on the surface of the epitaxial wafer so as to prepare a mesa isolation pattern, a groove is etched in the surface of the epitaxial wafer of the rectifier obtained in the step (12) by using a reactive ion etching apparatus, an etching depth being 1.5 μm, and finally the surface of the epitaxial wafer is cleaned with deionized water and blow-dried with nitrogen;

(13) manufacturing the mesa isolation passivation layer: the epitaxial wafer of the rectifier is put in a plasma-assisted chemical vapor deposition apparatus, the step (9) is repeated, and the SiN$_x$ passivation layer is deposited in the groove etched in the epitaxial wafer of the rectifier, a deposition time being 75 min; and (14) the step (11) is repeated to remove residual SiN$_x$ layer on the surface of the epitaxial wafer of the rectifier; and then the step (6) is repeated to remove the residual SiN$_x$ and photoresist on the surface of the epitaxial wafer of the rectifier so as to complete preparation of the GaN/two-dimensional MN heterojunction rectifier on a silicon substrate.

Figure 2:
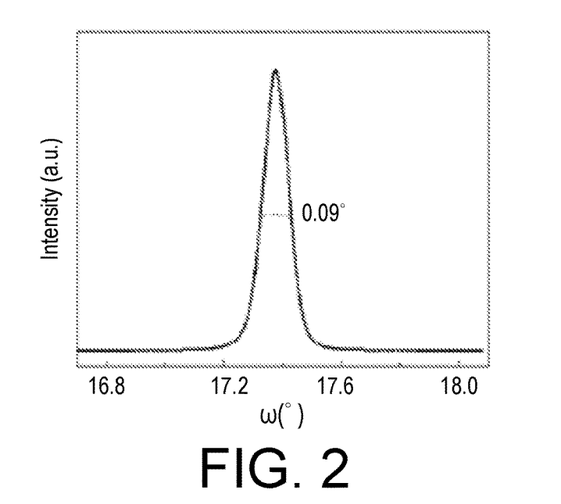
FIG. 2 is a GaN(0002) x-ray swing curve diagram of an embodiment 1 of the present invention.
Figure 3:
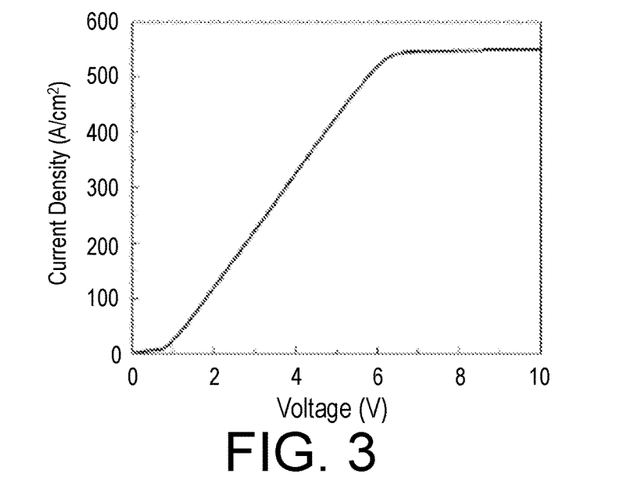
FIG. 3 is a forward J-V curve diagram of a rectifier of an embodiment 1 of the present invention.
Figure 4:
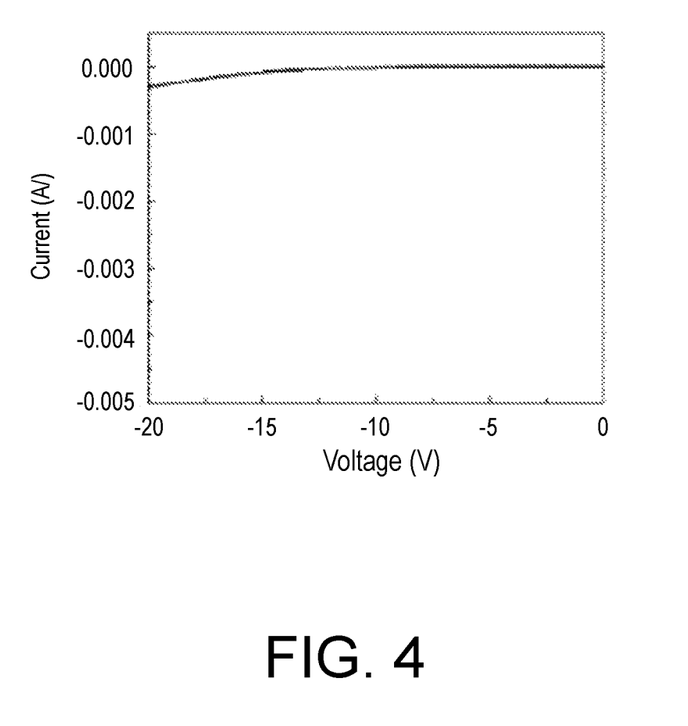
FIG. 4 is a reverse I-V curve diagram of a rectifier of an embodiment 1 of the present invention.

The GaN(0002) x-ray swing curve diagram of the GaN film of the rectifier prepared by the embodiment is as shown in FIG. 2, with a full width half maximum of 0.09°. The forward J-V curve diagram of the epitaxial wafer is as shown in FIG. 3, the threshold voltage is 0.75V, and the calculated specific on-resistance $R_{ON}$ is 8.8 mΩ/sq. Therefore, under a condition that it works at high power, the device is good in stability and reliability. The reverse I-V curve diagram of the epitaxial wafer is as shown in FIG. 4, and under a reverse bias of −20V, the leak current of the device is −0.0003 A, so that the rectifier is good in reverse leakage performance. Meanwhile, the electron gas concentration of the rectifier prepared in the embodiment reaches up to $10^{14}$ cm$^{-2}$, and the electron mobility reaches up to 3000 cm$^2$/Vs.

Embodiment 2

A method for preparing a chip of a rectifier on a silicon substrate suitable for working at an alternating current frequency includes:

(1) an epitaxial wafer of a rectifier is grown on a silicon substrate by adopting a low-temperature pulsed laser deposition technology, the epitaxial wafer including a GaN buffer layer 2 grown on the silicon substrate 1, a carbon-doped semi-insulating GaN layer 3 grown on the GaN buffer layer 2 with a doping concentration of $5.9 \times 10^{18}$ cm$^{-3}$, a non-doped two-dimensional MN layer 4 grown on the carbon-doped semi-insulating GaN layer 3, a non-doped GaN layer 5 grown on the non-doped two-dimensional MN layer 4 and a non-doped InGaN layer 6 grown on the non-doped GaN layer, wherein a thickness of the GaN buffer layer is 650 nm, a thickness of the carbon-doped semi-insulating GaN layer is 120 nm, a thickness of the non-doped two-dimensional MN layer is 3 atomic layers, a thickness of the non-doped GaN layer is 350 nm, and a thickness of the non-doped InGaN layer is 50 nm;

(2) the epitaxial wafer of the rectifier is put in acetone and anhydrous ethanol in sequence for ultrasonic treatment for 5 min, the epitaxial wafer of the rectifier is taken out, the epitaxial wafer of the rectifier is cleaned with deionized water, and then the epitaxial wafer of the rectifier is blow-dried with nitrogen;

(3) the cleaned epitaxial wafer of the rectifier is spin-coated with a positive photoresist with a model of AZ5214 and a thickness of 0.3 μm, the epitaxial wafer coated with the photoresist is placed on a heating stage to be pre-dried for 45 s, then it is put in a lithography machine to be exposed for 3 s, then the exposed epitaxial wafer is immersed into a developing solution with a model of RZX3038 for 45 s, so that a pattern on the epitaxial wafer emerged, and the epitaxial wafer is cleaned with deionized water and blow-dried with nitrogen; and finally, the epitaxial wafer is placed on the heating stage to be hard baked for 45 s;

(4) a groove is etched along the Schottky contact electrode pattern in the epitaxial wafer of the rectifier by utilizing a reactive ion etching method, a depth of the groove being 250 nm;

(5) the epitaxial wafer of the rectifier etched with the groove with the ohmic contact electrode pattern obtained in the step (4) is put in an electron beam evaporation apparatus, a cavity is vacuumized to $3.5 \times 10^{-5}$ Pa, and then electrode metals MoS$_2$/Ni/Au are evaporated in sequence; and after evaporation, the epitaxial wafer of the rectifier is annealed at 700° C. for 90 min;

(6) the epitaxial wafer of the rectifier with the ohmic contact electrode is immersed into a stripping liquid for photoresist for 40 min, the epitaxial wafer of the rectifier is cleaned with deionized water after being fished out, then the epitaxial wafer of the rectifier is put in acetone for ultrasonic treatment for 5 min, and the epitaxial wafer of the rectifier is taken out, cleaned with deionized water and blow-dried with nitrogen;

(7) the epitaxial wafer of the rectifier is aligned with an alignment mark in a mask, a lithography process in the step (3) is repeated, and lithography development is performed in a corresponding position to prepare an area with the exposed Schottky contact electrode pattern on the epitaxial wafer of the rectifier;

(8) the ohmic contact electrode 9 is prepared for the photoetched epitaxial wafer of the rectifier: the epitaxial wafer of the rectifier with the ohmic contact electrode pattern is put in an electron beam evaporation device, a cavity is vacuumized to $3.5 \times 10^{-5}$ Pa, and then ohmic contact electrode substances Ti/Al/Ni/Au are evaporated in sequence; and after evaporation, the epitaxial wafer of the rectifier is annealed at 700° C. for 90 min; finally the step (6) is repeated to remove residual photoresist and evaporation metals on the surface of the epitaxial wafer;

(9) a SiN$_x$ passivation layer 7 is prepared by using a plasma-enhanced chemical vapor deposition method: the epitaxial wafer of the rectifier with the prepared electrode is put in a plasma-enhanced chemical vapor deposition apparatus, the apparatus is heated to 800° C., and a cavity is vacuumized to $3.5 \times 10^{-5}$ Pa, a deposition time being 75 min;

(10) the step (3) is repeated, a mask is prepared on the surface of the epitaxial wafer by means of lithography development, and SiN$_x$ (x=1.33 to 1.5) on the ohmic contact electrode and the Schottky contact electrode pattern is exposed;

(11) the exposed SiN$_x$ passivation layer is etched by using a wet etching method, is taken out and is cleaned with deionized water, and finally the step (6) is repeated to remove residual photoresist and SiN$_x$ on the surface of the epitaxial wafer of the rectifier;

(12) aligned by the alignment mark in the mask, and the steps (3) and (4) are repeated to perform lithography development on the surface of the epitaxial wafer so as to prepare a mesa isolation pattern, a groove is etched in the surface of the epitaxial wafer of the rectifier, an etching depth being 1.5 μm, and finally the surface of the epitaxial wafer is cleaned with deionized water and blow-dried with nitrogen;

(13) manufacturing the mesa isolation passivation layer: the epitaxial wafer of the rectifier is put in a plasma-assisted chemical vapor deposition apparatus, the process in the step (9) is repeated, and the SiN$_x$ passivation layer is deposited in the groove etched in the epitaxial wafer of the rectifier, a deposition time being 75 min; and (14) the step (11) is repeated to remove residual SiN$_x$ layer on the surface of the epitaxial wafer of the rectifier, and then the step (6) is repeated to remove the residual SiN$_x$ and photoresist on the surface of the epitaxial wafer of the rectifier so as to finally complete preparation of the GaN/two-dimensional MN heterojunction rectifier on a silicon substrate.

The full width half maximum of a GaN (0002) x-ray swing curve of the GaN film prepared in the embodiment is 0.09°. In the forward J-V curve of the prepared epitaxial wafer, the threshold voltage is 0.78V, and the calculated specific on-resistance $R_{ON}$ is 9.1 me/sq. Therefore, under a condition that it works at high power, the device is good in stability and reliability. In the reverse I-V curve, and under a reverse bias of −20V, the leak current of the device is −0.0003 A, so that the rectifier is good in reverse leakage performance. Meanwhile, the electron gas concentration of the rectifier prepared in the embodiment reaches up to $10^{14}$ cm$^{-2}$, and the electron mobility reaches up to 2900 cm$^2$/Vs.

Embodiment 3

A method for preparing a chip of a rectifier on a silicon substrate suitable for working at an alternating current frequency includes:
(1) an epitaxial wafer of a rectifier is grown on a silicon substrate by adopting a low-temperature pulsed laser deposition technology, the epitaxial wafer including a GaN buffer layer 2 grown on the silicon substrate 1, a carbon-doped semi-insulating GaN layer 3 grown on the GaN buffer layer 2 with a doping concentration of $5.9 \times 10^{18}$ cm$^{-3}$, a non-doped two-dimensional MN layer 4 grown on the carbon-doped semi-insulating GaN layer 3, a non-doped GaN layer 5 grown on the non-doped two-dimensional MN layer 4 and a non-doped InGaN layer 6 grown on the non-doped GaN layer, wherein a thickness of the buffer layer is 900 nm, a thickness of the carbon-doped semi-insulating GaN layer is 180 nm, a thickness of the non-doped two-dimensional MN layer is 4 atomic layers, a thickness of the non-doped GaN layer is 550 nm, and a thickness of the non-doped InGaN layer is 200 nm;
(2) the epitaxial wafer of the rectifier is put in acetone and anhydrous ethanol in sequence for ultrasonic treatment for 8 min, the epitaxial wafer of the rectifier is taken out, the epitaxial wafer of the rectifier is cleaned with deionized water, and then the epitaxial wafer of the rectifier is blow-dried with nitrogen;
(3) the cleaned epitaxial wafer of the rectifier is spin-coated with a positive photoresist with a model of AZ5214 and a thickness of 0.9 µm; the epitaxial wafer coated with the photoresist is placed on a heating stage to be pre-dried for 45 s, then it is put in a lithography machine to be exposed for 7 s, then the exposed epitaxial wafer is immersed into a developing solution with a model of RZX3038 for 45 s, so that a pattern on the epitaxial wafer emerged, and the epitaxial wafer is cleaned with deionized water and blow-dried with nitrogen; and finally, the epitaxial wafer is placed on the heating stage to be hard baked for 45 s;
(4) a groove is etched along the Schottky contact electrode pattern in the epitaxial wafer of the rectifier by utilizing a reactive ion etching method, a depth of the groove being 250 nm;
(5) the epitaxial wafer of the rectifier etched with the groove with the ohmic contact electrode pattern obtained in the step (4) is put in an electron beam evaporation apparatus, a cavity is vacuumized to $5.5 \times 10^5$ Pa, and then the electrode metals MoS$_2$/Ni/Au are evaporated in sequence; after evaporation, the epitaxial wafer of the rectifier is annealed at 700° C. for 90 min;
(6) the epitaxial wafer of the rectifier with the ohmic contact electrode is immersed into a stripping liquid for photoresist for 95 min, the epitaxial wafer of the rectifier is cleaned with deionized water after being fished out, then the epitaxial wafer of the rectifier is put in acetone for ultrasonic treatment for 8 min, and the epitaxial wafer of the rectifier is taken out, cleaned with deionized water and blow-dried with nitrogen;
(7) the epitaxial wafer of the rectifier is aligned with an alignment mark in a mask, a lithography process in the step (3) is repeated, and lithography development is performed in a corresponding position to prepare an area with the exposed Schottky contact electrode pattern on the epitaxial wafer of the rectifier;
(8) the ohmic contact electrode 9 is prepared for the photoetched epitaxial wafer of the rectifier: the epitaxial wafer of the rectifier with the ohmic contact electrode pattern is put in an electron beam evaporation device, a cavity is vacuumized to $5.5 \times 10^{-5}$ Pa, and then ohmic contact electrode substances Ti/Al/Ni/Au are evaporated in sequence; and finally the process in the step (6) is repeated to remove residual photoresist and evaporation metals on the surface of the epitaxial wafer;
(9) a SiN$_x$ passivation layer 7 is prepared by using a plasma-enhanced chemical vapor deposition method: the epitaxial wafer of the rectifier with the prepared electrode is put in a plasma-enhanced chemical vapor deposition apparatus, the apparatus is heated to 800° C., and a cavity is vacuumized to $1 \times 10^{-5}$ Pa, a deposition time being 110 min;
(10) the process in the step (3) is repeated, a mask is prepared on the surface of the epitaxial wafer by means of lithography development, and SiN$_x$ (x=1.33 to 1.5) on the ohmic contact electrode and the Schottky contact electrode pattern is exposed;
(11) the exposed SiN$_x$ passivation layer is etched by using a wet etching method, is taken out and is cleaned with deionized water, and finally the process in the step (6) is repeated to remove residual photoresist and SiN$_x$ on the surface of the epitaxial wafer;
(12) aligned by the mask in the alignment mark, and the steps (3) and (4) are repeated to perform lithography development on the surface of the epitaxial wafer so as to prepare a mesa isolation pattern, a groove is etched in the surface of the epitaxial wafer of the rectifier, an etching depth being 1.5 µm, and finally the surface of the epitaxial wafer is cleaned with deionized water and blow-dried with nitrogen;
(13) manufacturing the mesa isolation passivation layer: the epitaxial wafer of the rectifier is put in a plasma-assisted chemical vapor deposition apparatus, the process in the step (9) is repeated, and the SiN$_x$ passivation layer is deposited in the groove etched in the epitaxial wafer of the rectifier, a deposition time being 110 min;
(14) after the residual SiN$_x$ layer on the surface of the epitaxial wafer of the rectifier is removed by using the wet etching process in the step (11), the residual photoresist and SiN$_x$ on the surface of the epitaxial wafer of the rectifier are removed by means of immersion in the stripping liquid for photoresist and ultrasonic cleaning by using the process in the step (6) so as to finally complete preparation of the GaN/two-dimensional MN heterojunction rectifier on a silicon substrate.

The full width half maximum of a GaN (0002) x-ray swing curve of the GaN film prepared in the embodiment is 0.095°. In the forward J-V curve of the prepared epitaxial wafer of the rectifier, the threshold voltage is 0.80V, and the calculated specific on-resistance R$_{ON}$ is 9.3 mΩ/sq. Therefore, under a condition that it works at high power, the device is good in stability and reliability. In the reverse I-V curve, and under a reverse bias of −20V, the leak current of the device is −0.00035 A, so that the rectifier is good in reverse leakage performance. Meanwhile, the electron gas concentration of the rectifier prepared in the embodiment reaches up to $10^{14}$ cm$^{-2}$, and the electron mobility reaches up to 3000 cm$^2$/Vs.

The embodiments are preferred modes of execution of the present invention. The modes of execution of the present invention are not limited by the embodiments. Any other changes, modifications, substitutions, combinations and simplifications made without departing from the spirit and principle of the present invention shall be equivalent substitute modes and shall come within the protection scope of the present invention.

What is claimed is:

1. A GaN/two-dimensional AlN heterojunction rectifier on a silicon substrate, comprising a silicon substrate, a GaN buffer layer, a carbon-doped semi-insulating GaN layer, a two-dimensional AlN layer, a non-doped GaN layer, a non-doped InGaN layer and a $SiN_x$ passivation layer that are stacked in sequence, and further comprising a mesa isolation groove and a Schottky contact electrode that are arranged at one side of the non-doped InGaN layer, wherein the mesa isolation groove is in contact with the non-doped GaN layer, the non-doped InGaN layer, the $SiN_x$ passivation layer and the Schottky contact electrode, and the Schottky contact electrode is in contact with the mesa isolation groove and the non-doped GaN layer.

2. The GaN/two-dimensional AlN heterojunction rectifier on the silicon substrate according to claim 1, wherein a thickness of the GaN buffer layer is 650-900 nm.

3. A method for preparing a GaN/two-dimensional AlN heterojunction rectifier on a silicon substrate according to claim 2, comprising the following steps:

a step (1): growing a GaN buffer layer, a carbon-doped semi-insulating GaN layer, a two-dimensional AlN layer, a non-doped GaN layer and a non-doped InGaN layer on a silicon substrate in sequence to obtain an epitaxial wafer of the rectifier;

a step (2): putting the epitaxial wafer of the rectifier obtained in the step (1) in acetone and anhydrous ethanol in sequence for ultrasonic treatment, taking the epitaxial wafer of the rectifier out, cleaning the epitaxial wafer of the rectifier with deionized water, and then blow-drying the epitaxial wafer of the rectifier with nitrogen;

a step (3): transferring a Schottky contact electrode pattern to the epitaxial wafer of the rectifier: evenly spin-coating a photoresist to the epitaxial wafer of the rectifier obtained in the step (2), then putting the epitaxial wafer of the rectifier in a lithography machine to be exposed, and finally cleaning the epitaxial wafer with a developing solution to reveal the pattern;

a step (4): etching a groove along the Schottky contact electrode pattern in the epitaxial wafer of the rectifier by utilizing a reactive ion etching method to obtain an ohmic contact electrode;

a step (5): preparing a Schottky contact electrode: putting the epitaxial wafer of the rectifier etched with the groove with the ohmic contact electrode pattern obtained in the step (4) in an electron beam evaporation apparatus, then vacuumizing a cavity, bombarding a metal target with an electronic gun so as to deposit a metal to a surface of the epitaxial wafer, and after evaporation, annealing the epitaxial wafer;

a step (6): immersing the epitaxial wafer of the rectifier into a stripping liquid for photoresist and cleaning the epitaxial wafer of the rectifier with deionized water, then putting the epitaxial wafer of the rectifier in acetone for ultrasonic treatment, and blow-drying the epitaxial wafer of the rectifier with nitrogen;

a step (7): aligning the epitaxial wafer of the rectifier with an alignment mark in a mask, repeating the step (3), performing lithography development in a corresponding position to prepare the ohmic contact electrode pattern and cleaning the pattern;

a step (8): preparing an ohmic contact electrode: repeating the steps (5) and (6), depositing an electrode metal, and performing annealing and cleaning to complete preparation of the ohmic contact electrode;

a step (9): preparing a silicon nitride passivation layer: putting the epitaxial wafer of the rectifier obtained in the step (8) in a plasma enhanced chemical vapor deposition apparatus, then raising the temperature, performing vacuumizing and introducing a carrier gas and a reaction gas in sequence, and finally depositing the $SiN_x$ passivation layer on the surface of the epitaxial wafer;

a step (10): repeating the step (3) to perform exposure and development at the ohmic contact electrode and the Schottky contact electrode so as to expose $SiN_x$ on the two electrodes;

a step (11): etching the exposed $SiN_x$ by using a wet etching method, and finally repeating the step (6) to remove residual photoresist and $SiN_x$ passivation layer on the surface of the epitaxial wafer of the rectifier;

a step (12): aligning by the alignment mark of the mask, and repeating the steps (3) and (4) so as to transfer a mesa isolation pattern to the surface of the epitaxial wafer and etch the groove in the surface;

a step (13): putting the epitaxial wafer of the rectifier obtained in the step (12) in a plasma-assisted chemical vapor deposition apparatus, repeating the step (8), and depositing the $SiN_x$ passivation layer in the groove etched in the step (12); and a step (14): after repeating the step (11) to remove the residual photoresist on the surface of the epitaxial wafer, removing the residual photoresist and $SiN_x$ on the surface of the epitaxial wafer of the rectifier by means of immersion in the stripping liquid for photoresist and ultrasonic cleaning so as to complete preparation of the GaN/two-dimensional AlN heterojunction rectifier on a silicon substrate.

4. The GaN/two-dimensional AlN heterojunction rectifier on a silicon substrate according to claim 1, wherein a doping concentration of the carbon-doped semi-insulating GaN layer is $5.0 \times 10^{18}$-$6.0 \times 10^{18}$ cm$^{-3}$, and a thickness of the carbon-doped semi-insulating GaN layer is 80 to 180 nm.

5. A method for preparing a GaN/two-dimensional AlN heterojunction rectifier on a silicon substrate according to claim 3, comprising the following steps:

a step (1): growing a GaN buffer layer, a carbon-doped semi-insulating GaN layer, a two-dimensional AlN layer, a non-doped GaN layer and a non-doped InGaN layer on a silicon substrate in sequence to obtain an epitaxial wafer of the rectifier;

a step (2): putting the epitaxial wafer of the rectifier obtained in the step (1) in acetone and anhydrous ethanol in sequence for ultrasonic treatment, taking the epitaxial wafer of the rectifier out, cleaning the epitaxial wafer of the rectifier with deionized water, and then blow-drying the epitaxial wafer of the rectifier with nitrogen;

a step (3): transferring a Schottky contact electrode pattern to the epitaxial wafer of the rectifier: evenly spin-coating a photoresist to the epitaxial wafer of the rectifier obtained in the step (2), then putting the epitaxial wafer of the rectifier in a lithography machine to be exposed, and finally cleaning the epitaxial wafer with a developing solution to reveal the pattern;

a step (4): etching a groove along the Schottky contact electrode pattern in the epitaxial wafer of the rectifier by utilizing a reactive ion etching method to obtain an ohmic contact electrode;

a step (5): preparing a Schottky contact electrode: putting the epitaxial wafer of the rectifier etched with the groove with the ohmic contact electrode pattern obtained in the step (4) in an electron beam evaporation apparatus, then vacuumizing a cavity, bombarding a metal target with an electronic gun so as to deposit a metal to a surface of the epitaxial wafer, and after evaporation, annealing the epitaxial wafer;

a step (6): immersing the epitaxial wafer of the rectifier into a stripping liquid for photoresist and cleaning the epitaxial wafer of the rectifier with deionized water, then putting the epitaxial wafer of the rectifier in acetone for ultrasonic treatment, and blow-drying the epitaxial wafer of the rectifier with nitrogen;

a step (7): aligning the epitaxial wafer of the rectifier with an alignment mark in a mask, repeating the step (3), performing lithography development in a corresponding position to prepare the ohmic contact electrode pattern and cleaning the pattern;

a step (8): preparing an ohmic contact electrode: repeating the steps (5) and (6), depositing an electrode metal, and performing annealing and cleaning to complete preparation of the ohmic contact electrode;

a step (9): preparing a silicon nitride passivation layer: putting the epitaxial wafer of the rectifier obtained in the step (8) in a plasma enhanced chemical vapor deposition apparatus, then raising the temperature, performing vacuumizing and introducing a carrier gas and a reaction gas in sequence, and finally depositing the $SiN_x$ passivation layer on the surface of the epitaxial wafer;

a step (10): repeating the step (3) to perform exposure and development at the ohmic contact electrode and the Schottky contact electrode so as to expose $SiN_x$ on the two electrodes;

a step (11): etching the exposed $SiN_x$ by using a wet etching method, and finally repeating the step (6) to remove residual photoresist and $SiN_x$ passivation layer on the surface of the epitaxial wafer of the rectifier;

a step (12): aligning by the alignment mark of the mask, and repeating the steps (3) and (4) so as to transfer a mesa isolation pattern to the surface of the epitaxial wafer and etch the groove in the surface;

a step (13): putting the epitaxial wafer of the rectifier obtained in the step (12) in a plasma-assisted chemical vapor deposition apparatus, repeating the step (8), and depositing the $SiN_x$ passivation layer in the groove etched in the step (12); and a step (14): after repeating the step (11) to remove the residual photoresist on the surface of the epitaxial wafer, removing the residual photoresist and $SiN_x$ on the surface of the epitaxial wafer of the rectifier by means of immersion in the stripping liquid for photoresist and ultrasonic cleaning so as to complete preparation of the GaN/two-dimensional AlN heterojunction rectifier on a silicon substrate.

6. The GaN/two-dimensional AlN heterojunction rectifier on the silicon substrate according to claim 1, wherein a thickness of the two-dimensional AlN layer is 2 to 4 atomic layers.

7. The GaN/two-dimensional AlN heterojunction rectifier on the silicon substrate according to claim 6, wherein the thickness of the two-dimensional AlN layer is 2 atomic layers.

8. A method for preparing a GaN/two-dimensional AlN heterojunction rectifier on a silicon substrate according to claim 5, comprising the following steps:

a step (1): growing a GaN buffer layer, a carbon-doped semi-insulating GaN layer, a two-dimensional AlN layer, a non-doped GaN layer and a non-doped InGaN layer on a silicon substrate in sequence to obtain an epitaxial wafer of the rectifier;

a step (2): putting the epitaxial wafer of the rectifier obtained in the step (1) in acetone and anhydrous ethanol in sequence for ultrasonic treatment, taking the epitaxial wafer of the rectifier out, cleaning the epitaxial wafer of the rectifier with deionized water, and then blow-drying the epitaxial wafer of the rectifier with nitrogen;

a step (3): transferring a Schottky contact electrode pattern to the epitaxial wafer of the rectifier: evenly spin-coating a photoresist to the epitaxial wafer of the rectifier obtained in the step (2), then putting the epitaxial wafer of the rectifier in a lithography machine to be exposed, and finally cleaning the epitaxial wafer with a developing solution to reveal the pattern;

a step (4): etching a groove along the Schottky contact electrode pattern in the epitaxial wafer of the rectifier by utilizing a reactive ion etching method to obtain an ohmic contact electrode;

a step (5): preparing a Schottky contact electrode: putting the epitaxial wafer of the rectifier etched with the groove with the ohmic contact electrode pattern obtained in the step (4) in an electron beam evaporation apparatus, then vacuumizing a cavity, bombarding a metal target with an electronic gun so as to deposit a metal to a surface of the epitaxial wafer, and after evaporation, annealing the epitaxial wafer;

a step (6): immersing the epitaxial wafer of the rectifier into a stripping liquid for photoresist and cleaning the epitaxial wafer of the rectifier with deionized water, then putting the epitaxial wafer of the rectifier in acetone for ultrasonic treatment, and blow-drying the epitaxial wafer of the rectifier with nitrogen;

a step (7): aligning the epitaxial wafer of the rectifier with an alignment mark in a mask, repeating the step (3), performing lithography development in a corresponding position to prepare the ohmic contact electrode pattern and cleaning the pattern;

a step (8): preparing an ohmic contact electrode: repeating the steps (5) and (6), depositing an electrode metal, and performing annealing and cleaning to complete preparation of the ohmic contact electrode;

a step (9): preparing a silicon nitride passivation layer: putting the epitaxial wafer of the rectifier obtained in the step (8) in a plasma enhanced chemical vapor deposition apparatus, then raising the temperature, performing vacuumizing and introducing a carrier gas and a reaction gas in sequence, and finally depositing the $SiN_x$ passivation layer on the surface of the epitaxial wafer;

a step (10): repeating the step (3) to perform exposure and development at the ohmic contact electrode and the Schottky contact electrode so as to expose $SiN_x$ on the two electrodes;

a step (11): etching the exposed $SiN_x$ by using a wet etching method, and finally repeating the step (6) to remove residual photoresist and $SiN_x$ passivation layer on the surface of the epitaxial wafer of the rectifier;

a step (12): aligning by the alignment mark of the mask, and repeating the steps (3) and (4) so as to transfer a mesa isolation pattern to the surface of the epitaxial wafer and etch the groove in the surface;

a step (13): putting the epitaxial wafer of the rectifier obtained in the step (12) in a plasma-assisted chemical vapor deposition apparatus, repeating the step (8), and depositing the $SiN_x$ passivation layer in the groove etched in the step (12); and a step (14): after repeating the step (11) to remove the residual photoresist on the surface of the epitaxial wafer, removing the residual photoresist and $SiN_x$ on the surface of the epitaxial wafer of the rectifier by means of immersion in the stripping liquid for photoresist and ultrasonic cleaning so as to complete preparation of the GaN/two-dimensional AlN heterojunction rectifier on a silicon substrate.

9. A method for preparing a GaN/two-dimensional AlN heterojunction rectifier on a silicon substrate according to claim 4, comprising the following steps:

a step (1): growing a GaN buffer layer, a carbon-doped semi-insulating GaN layer, a two-dimensional AlN layer, a non-doped GaN layer and a non-doped InGaN layer on a silicon substrate in sequence to obtain an epitaxial wafer of the rectifier;

a step (2): putting the epitaxial wafer of the rectifier obtained in the step (1) in acetone and anhydrous ethanol in sequence for ultrasonic treatment, taking the epitaxial wafer of the rectifier out, cleaning the epitaxial wafer of the rectifier with deionized water, and then blow-drying the epitaxial wafer of the rectifier with nitrogen;

a step (3): transferring a Schottky contact electrode pattern to the epitaxial wafer of the rectifier: evenly spin-coating a photoresist to the epitaxial wafer of the rectifier obtained in the step (2), then putting the epitaxial wafer of the rectifier in a lithography machine to be exposed, and finally cleaning the epitaxial wafer with a developing solution to reveal the pattern;

a step (4): etching a groove along the Schottky contact electrode pattern in the epitaxial wafer of the rectifier by utilizing a reactive ion etching method to obtain an ohmic contact electrode;

a step (5): preparing a Schottky contact electrode: putting the epitaxial wafer of the rectifier etched with the groove with the ohmic contact electrode pattern obtained in the step (4) in an electron beam evaporation apparatus, then vacuumizing a cavity, bombarding a metal target with an electronic gun so as to deposit a metal to a surface of the epitaxial wafer, and after evaporation, annealing the epitaxial wafer;

a step (6): immersing the epitaxial wafer of the rectifier into a stripping liquid for photoresist and cleaning the epitaxial wafer of the rectifier with deionized water, then putting the epitaxial wafer of the rectifier in acetone for ultrasonic treatment, and blow-drying the epitaxial wafer of the rectifier with nitrogen;

a step (7): aligning the epitaxial wafer of the rectifier with an alignment mark in a mask, repeating the step (3), performing lithography development in a corresponding position to prepare the ohmic contact electrode pattern and cleaning the pattern;

a step (8): preparing an ohmic contact electrode: repeating the steps (5) and (6), depositing an electrode metal, and performing annealing and cleaning to complete preparation of the ohmic contact electrode;

a step (9): preparing a silicon nitride passivation layer: putting the epitaxial wafer of the rectifier obtained in the step (8) in a plasma enhanced chemical vapor deposition apparatus, then raising the temperature, performing vacuumizing and introducing a carrier gas and a reaction gas in sequence, and finally depositing the $SiN_x$ passivation layer on the surface of the epitaxial wafer;

a step (10): repeating the step (3) to perform exposure and development at the ohmic contact electrode and the Schottky contact electrode so as to expose $SiN_x$ on the two electrodes;

a step (11): etching the exposed $SiN_x$ by using a wet etching method, and finally repeating the step (6) to remove residual photoresist and SiN passivation layer on the surface of the epitaxial wafer of the rectifier;

a step (12): aligning by the alignment mark of the mask, and repeating the steps (3) and (4) so as to transfer a mesa isolation pattern to the surface of the epitaxial wafer and etch the groove in the surface;

a step (13): putting the epitaxial wafer of the rectifier obtained in the step (12) in a plasma-assisted chemical vapor deposition apparatus, repeating the step (8), and depositing the $SiN_x$ passivation layer in the groove etched in the step (12); and a step (14): after repeating the step (11) to remove the residual photoresist on the surface of the epitaxial wafer, removing the residual photoresist and $SiN_x$ on the surface of the epitaxial wafer of the rectifier by means of immersion in the stripping liquid for photoresist and ultrasonic cleaning so as to complete preparation of the GaN/two-dimensional AlN heterojunction rectifier on a silicon substrate.

10. The GaN/two-dimensional AlN heterojunction rectifier on the silicon substrate according to claim 1, wherein a thickness of the non-doped GaN layer is 350 to 550 nm.

11. A method for preparing a GaN/two-dimensional AlN heterojunction rectifier on a silicon substrate according to claim 6, comprising the following steps:

a step (1): growing a GaN buffer layer, a carbon-doped semi-insulating GaN layer, a two-dimensional AlN layer, a non-doped GaN layer and a non-doped InGaN layer on a silicon substrate in sequence to obtain an epitaxial wafer of the rectifier;

a step (2): putting the epitaxial wafer of the rectifier obtained in the step (1) in acetone and anhydrous ethanol in sequence for ultrasonic treatment, taking the epitaxial wafer of the rectifier out, cleaning the epitaxial wafer of the rectifier with deionized water, and then blow-drying the epitaxial wafer of the rectifier with nitrogen;

a step (3): transferring a Schottky contact electrode pattern to the epitaxial wafer of the rectifier: evenly spin-coating a photoresist to the epitaxial wafer of the rectifier obtained in the step (2), then putting the epitaxial wafer of the rectifier in a lithography machine to be exposed, and finally cleaning the epitaxial wafer with a developing solution to reveal the pattern;

a step (4): etching a groove along the Schottky contact electrode pattern in the epitaxial wafer of the rectifier by utilizing a reactive ion etching method to obtain an ohmic contact electrode;

a step (5): preparing a Schottky contact electrode: putting the epitaxial wafer of the rectifier etched with the groove with the ohmic contact electrode pattern obtained in the step (4) in an electron beam evaporation apparatus, then vacuumizing a cavity, bombarding a metal target with an electronic gun so as to deposit a metal to a surface of the epitaxial wafer, and after evaporation, annealing the epitaxial wafer;

a step (6): immersing the epitaxial wafer of the rectifier into a stripping liquid for photoresist and cleaning the epitaxial wafer of the rectifier with deionized water, then putting the epitaxial wafer of the rectifier in acetone for ultrasonic treatment, and blow-drying the epitaxial wafer of the rectifier with nitrogen;

a step (7): aligning the epitaxial wafer of the rectifier with an alignment mark in a mask, repeating the step (3), performing lithography development in a corresponding position to prepare the ohmic contact electrode pattern and cleaning the pattern;

a step (8): preparing an ohmic contact electrode: repeating the steps (5) and (6), depositing an electrode metal, and performing annealing and cleaning to complete preparation of the ohmic contact electrode;

a step (9): preparing a silicon nitride passivation layer: putting the epitaxial wafer of the rectifier obtained in the step (8) in a plasma enhanced chemical vapor deposition apparatus, then raising the temperature, performing vacuumizing and introducing a carrier gas and a reaction gas in sequence, and finally depositing the $SiN_x$ passivation layer on the surface of the epitaxial wafer;

a step (10): repeating the step (3) to perform exposure and development at the ohmic contact electrode and the Schottky contact electrode so as to expose $SiN_x$ on the two electrodes;

a step (11): etching the exposed $SiN_x$ by using a wet etching method, and finally repeating the step (6) to remove residual photoresist and $SiN_x$ passivation layer on the surface of the epitaxial wafer of the rectifier;

a step (12): aligning by the alignment mark of the mask, and repeating the steps (3) and (4) so as to transfer a mesa isolation pattern to the surface of the epitaxial wafer and etch the groove in the surface;

a step (13): putting the epitaxial wafer of the rectifier obtained in the step (12) in a plasma-assisted chemical vapor deposition apparatus, repeating the step (8), and depositing the $SiN_x$ passivation layer in the groove etched in the step (12); and a step (14): after repeating the step (11) to remove the residual photoresist on the surface of the epitaxial wafer, removing the residual photoresist and $SiN_x$ on the surface of the epitaxial wafer of the rectifier by means of immersion in the stripping liquid for photoresist and ultrasonic cleaning so as to complete preparation of the GaN/two-dimensional AlN heterojunction rectifier on a silicon substrate.

12. The GaN/two-dimensional AlN heterojunction rectifier on the silicon substrate according to claim 1, wherein a thickness of the non-doped InGaN layer is 50 to 200 nm.

13. A method for preparing a GaN/two-dimensional AlN heterojunction rectifier on a silicon substrate according to claim 7, comprising the following steps:

a step (1): growing a GaN buffer layer, a carbon-doped semi-insulating GaN layer, a two-dimensional AlN layer, a non-doped GaN layer and a non-doped InGaN layer on a silicon substrate in sequence to obtain an epitaxial wafer of the rectifier;

a step (2): putting the epitaxial wafer of the rectifier obtained in the step (1) in acetone and anhydrous ethanol in sequence for ultrasonic treatment, taking the epitaxial wafer of the rectifier out, cleaning the epitaxial wafer of the rectifier with deionized water, and then blow-drying the epitaxial wafer of the rectifier with nitrogen;

a step (3): transferring a Schottky contact electrode pattern to the epitaxial wafer of the rectifier: evenly spin-coating a photoresist to the epitaxial wafer of the rectifier obtained in the step (2), then putting the epitaxial wafer of the rectifier in a lithography machine to be exposed, and finally cleaning the epitaxial wafer with a developing solution to reveal the pattern;

a step (4): etching a groove along the Schottky contact electrode pattern in the epitaxial wafer of the rectifier by utilizing a reactive ion etching method to obtain an ohmic contact electrode;

a step (5): preparing a Schottky contact electrode: putting the epitaxial wafer of the rectifier etched with the groove with the ohmic contact electrode pattern obtained in the step (4) in an electron beam evaporation apparatus, then vacuumizing a cavity, bombarding a metal target with an electronic gun so as to deposit a metal to a surface of the epitaxial wafer, and after evaporation, annealing the epitaxial wafer;

a step (6): immersing the epitaxial wafer of the rectifier into a stripping liquid for photoresist and cleaning the epitaxial wafer of the rectifier with deionized water, then putting the epitaxial wafer of the rectifier in acetone for ultrasonic treatment, and blow-drying the epitaxial wafer of the rectifier with nitrogen;

a step (7): aligning the epitaxial wafer of the rectifier with an alignment mark in a mask, repeating the step (3), performing lithography development in a corresponding position to prepare the ohmic contact electrode pattern and cleaning the pattern;

a step (8): preparing an ohmic contact electrode: repeating the steps (5) and (6), depositing an electrode metal, and performing annealing and cleaning to complete preparation of the ohmic contact electrode;

a step (9): preparing a silicon nitride passivation layer: putting the epitaxial wafer of the rectifier obtained in the step (8) in a plasma enhanced chemical vapor deposition apparatus, then raising the temperature, performing vacuumizing and introducing a carrier gas and a reaction gas in sequence, and finally depositing the $SiN_x$ passivation layer on the surface of the epitaxial wafer;

a step (10): repeating the step (3) to perform exposure and development at the ohmic contact electrode and the Schottky contact electrode so as to expose $SiN_x$ on the two electrodes;

a step (11): etching the exposed $SiN_x$ by using a wet etching method, and finally repeating the step (6) to remove residual photoresist and $SiN_x$ passivation layer on the surface of the epitaxial wafer of the rectifier;

a step (12): aligning by the alignment mark of the mask, and repeating the steps (3) and (4) so as to transfer a mesa isolation pattern to the surface of the epitaxial wafer and etch the groove in the surface;

a step (13): putting the epitaxial wafer of the rectifier obtained in the step (12) in a plasma-assisted chemical vapor deposition apparatus, repeating the step (8), and depositing the $SiN_x$ passivation layer in the groove etched in the step (12); and a step (14): after repeating the step (11) to remove the residual photoresist on the surface of the epitaxial wafer, removing the residual photoresist and $SiN_x$ on the surface of the epitaxial wafer of the rectifier by means of immersion in the stripping liquid for photoresist and ultrasonic cleaning so as to complete preparation of the GaN/two-dimensional AlN heterojunction rectifier on a silicon substrate.

14. The GaN/two-dimensional AlN heterojunction rectifier on the silicon substrate according to claim 1, wherein x in the $SiN_x$ passivation layer is equal to 1.29 to 1.51.

15. A method for preparing a GaN/two-dimensional AlN heterojunction rectifier on a silicon substrate according to claim 14, comprising the following steps:
   a step (1): growing a GaN buffer layer, a carbon-doped semi-insulating GaN layer, a two-dimensional AlN layer, a non-doped GaN layer and a non-doped InGaN layer on a silicon substrate in sequence to obtain an epitaxial wafer of the rectifier;
   a step (2): putting the epitaxial wafer of the rectifier obtained in the step (1) in acetone and anhydrous ethanol in sequence for ultrasonic treatment, taking the epitaxial wafer of the rectifier out, cleaning the epitaxial wafer of the rectifier with deionized water, and then blow-drying the epitaxial wafer of the rectifier with nitrogen;
   a step (3): transferring a Schottky contact electrode pattern to the epitaxial wafer of the rectifier: evenly spin-coating a photoresist to the epitaxial wafer of the rectifier obtained in the step (2), then putting the epitaxial wafer of the rectifier in a lithography machine to be exposed, and finally cleaning the epitaxial wafer with a developing solution to reveal the pattern;
   a step (4): etching a groove along the Schottky contact electrode pattern in the epitaxial wafer of the rectifier by utilizing a reactive ion etching method to obtain an ohmic contact electrode;
   a step (5): preparing a Schottky contact electrode: putting the epitaxial wafer of the rectifier etched with the groove with the ohmic contact electrode pattern obtained in the step (4) in an electron beam evaporation apparatus, then vacuumizing a cavity, bombarding a metal target with an electronic gun so as to deposit a metal to a surface of the epitaxial wafer, and after evaporation, annealing the epitaxial wafer;
   a step (6): immersing the epitaxial wafer of the rectifier into a stripping liquid for photoresist and cleaning the epitaxial wafer of the rectifier with deionized water, then putting the epitaxial wafer of the rectifier in acetone for ultrasonic treatment, and blow-drying the epitaxial wafer of the rectifier with nitrogen;
   a step (7): aligning the epitaxial wafer of the rectifier with an alignment mark in a mask, repeating the step (3), performing lithography development in a corresponding position to prepare the ohmic contact electrode pattern and cleaning the pattern;
   a step (8): preparing an ohmic contact electrode: repeating the steps (5) and (6), depositing an electrode metal, and performing annealing and cleaning to complete preparation of the ohmic contact electrode;
   a step (9): preparing a silicon nitride passivation layer: putting the epitaxial wafer of the rectifier obtained in the step (8) in a plasma enhanced chemical vapor deposition apparatus, then raising the temperature, performing vacuumizing and introducing a carrier gas and a reaction gas in sequence, and finally depositing the $SiN_x$ passivation layer on the surface of the epitaxial wafer;
   a step (10): repeating the step (3) to perform exposure and development at the ohmic contact electrode and the Schottky contact electrode so as to expose $SiN_x$ on the two electrodes;
   a step (11): etching the exposed $SiN_x$ by using a wet etching method, and finally repeating the step (6) to remove residual photoresist and $SiN_x$ passivation layer on the surface of the epitaxial wafer of the rectifier;
   a step (12): aligning by the alignment mark of the mask, and repeating the steps (3) and (4) so as to transfer a mesa isolation pattern to the surface of the epitaxial wafer and etch the groove in the surface;
   a step (13): putting the epitaxial wafer of the rectifier obtained in the step (12) in a plasma-assisted chemical vapor deposition apparatus, repeating the step (8), and depositing the $SiN_x$ passivation layer in the groove etched in the step (12); and
   a step (14): after repeating the step (11) to remove the residual photoresist on the surface of the epitaxial wafer, removing the residual photoresist and $SiN_x$ on the surface of the epitaxial wafer of the rectifier by means of immersion in the stripping liquid for photoresist and ultrasonic cleaning so as to complete preparation of the GaN/two-dimensional AlN heterojunction rectifier on a silicon substrate.

16. The GaN/two-dimensional AlN heterojunction rectifier on a silicon substrate according to claim 1, wherein a depth of the mesa isolation groove is 1.2 to 1.5 μm, and a thickness of the Schottky contact electrode is 220 to 250 nm.

17. A method for preparing a GaN/two-dimensional AlN heterojunction rectifier on a silicon substrate according to claim 16, comprising the following steps:
   a step (1): growing a GaN buffer layer, a carbon-doped semi-insulating GaN layer, a two-dimensional AlN layer, a non-doped GaN layer and a non-doped InGaN layer on a silicon substrate in sequence to obtain an epitaxial wafer of the rectifier;
   a step (2): putting the epitaxial wafer of the rectifier obtained in the step (1) in acetone and anhydrous ethanol in sequence for ultrasonic treatment, taking the epitaxial wafer of the rectifier out, cleaning the epitaxial wafer of the rectifier with deionized water, and then blow-drying the epitaxial wafer of the rectifier with nitrogen;
   a step (3): transferring a Schottky contact electrode pattern to the epitaxial wafer of the rectifier: evenly spin-coating a photoresist to the epitaxial wafer of the rectifier obtained in the step (2), then putting the epitaxial wafer of the rectifier in a lithography machine to be exposed, and finally cleaning the epitaxial wafer with a developing solution to reveal the pattern;
   a step (4): etching a groove along the Schottky contact electrode pattern in the epitaxial wafer of the rectifier by utilizing a reactive ion etching method to obtain an ohmic contact electrode;
   a step (5): preparing a Schottky contact electrode: putting the epitaxial wafer of the rectifier etched with the groove with the ohmic contact electrode pattern obtained in the step (4) in an electron beam evaporation apparatus, then vacuumizing a cavity, bombarding a metal target with an electronic gun so as to deposit a metal to a surface of the epitaxial wafer, and after evaporation, annealing the epitaxial wafer;
   a step (6): immersing the epitaxial wafer of the rectifier into a stripping liquid for photoresist and cleaning the epitaxial wafer of the rectifier with deionized water, then putting the epitaxial wafer of the rectifier in acetone for ultrasonic treatment, and blow-drying the epitaxial wafer of the rectifier with nitrogen;
   a step (7): aligning the epitaxial wafer of the rectifier with an alignment mark in a mask, repeating the step (3), performing lithography development in a corresponding position to prepare the ohmic contact electrode pattern and cleaning the pattern;

a step (8): preparing an ohmic contact electrode: repeating the steps (5) and (6), depositing an electrode metal, and performing annealing and cleaning to complete preparation of the ohmic contact electrode;

a step (9): preparing a silicon nitride passivation layer: putting the epitaxial wafer of the rectifier obtained in the step (8) in a plasma enhanced chemical vapor deposition apparatus, then raising the temperature, performing vacuumizing and introducing a carrier gas and a reaction gas in sequence, and finally depositing the $SiN_x$ passivation layer on the surface of the epitaxial wafer;

a step (10): repeating the step (3) to perform exposure and development at the ohmic contact electrode and the Schottky contact electrode so as to expose $SiN_x$ on the two electrodes;

a step (11): etching the exposed $SiN_x$ by using a wet etching method, and finally repeating the step (6) to remove residual photoresist and $SiN_x$ passivation layer on the surface of the epitaxial wafer of the rectifier;

a step (12): aligning by the alignment mark of the mask, and repeating the steps (3) and (4) so as to transfer a mesa isolation pattern to the surface of the epitaxial wafer and etch the groove in the surface;

a step (13): putting the epitaxial wafer of the rectifier obtained in the step (12) in a plasma-assisted chemical vapor deposition apparatus, repeating the step (8), and depositing the $SiN_x$ passivation layer in the groove etched in the step (12); and a step (14): after repeating the step (11) to remove the residual photoresist on the surface of the epitaxial wafer, removing the residual photoresist and $SiN_x$ on the surface of the epitaxial wafer of the rectifier by means of immersion in the stripping liquid for photoresist and ultrasonic cleaning so as to complete preparation of the GaN/two-dimensional AlN heterojunction rectifier on a silicon substrate.

18. A method for preparing a GaN/two-dimensional AlN heterojunction rectifier on a silicon substrate according to claim 1, comprising the following steps:

a step (1); growing a GaN buffer layer, a carbon-doped semi-insulating GaN layer, a two-dimensional AlN layer, a non-doped GaN layer and a non-doped InGaN layer on a silicon substrate in sequence to obtain an epitaxial wafer of the rectifier;

a step (2): putting the epitaxial wafer of the rectifier obtained in the step (1) in acetone and anhydrous ethanol in sequence for ultrasonic treatment, taking the epitaxial wafer of the rectifier out, cleaning the epitaxial wafer of the rectifier with deionized water, and then blow-drying the epitaxial wafer of the rectifier with nitrogen;

a step (3); transferring a Schottky contact electrode pattern to the epitaxial wafer of the rectifier: evenly spin-coating a photoresist to the epitaxial wafer of the rectifier obtained in the step (2), then putting the epitaxial wafer of the rectifier in a lithography machine to be exposed, and finally cleaning the epitaxial wafer with a developing solution to reveal the pattern;

a step (4); etching a groove along the Schottky contact electrode pattern in the epitaxial wafer of the rectifier by utilizing a reactive ion etching method to obtain an ohmic contact electrode;

a step (5): preparing a Schottky contact electrode: putting the epitaxial wafer of the rectifier etched with the groove with the ohmic contact electrode pattern obtained in the step (4) in an electron beam evaporation apparatus, then vacuumizing a cavity, bombarding a metal target with an electronic gun so as to deposit a metal to a surface of the epitaxial wafer, and after evaporation, annealing the epitaxial wafer;

a step (6); immersing the epitaxial wafer of the rectifier into a stripping liquid for photoresist and cleaning the epitaxial wafer of the rectifier with deionized water, then putting the epitaxial wafer of the rectifier in acetone for ultrasonic treatment, and blow-drying the epitaxial wafer of the rectifier with nitrogen;

a step (7): aligning the epitaxial wafer of the rectifier with an alignment mark in a mask, repeating the step (3), performing lithography development in a corresponding position to prepare the ohmic contact electrode pattern and cleaning the pattern;

a step (8); preparing an ohmic contact electrode: repeating the steps (5) and (6), depositing an electrode metal, and performing annealing and cleaning to complete preparation of the ohmic contact electrode;

a step (9); preparing a silicon nitride passivation layer: putting the epitaxial wafer of the rectifier obtained in the step (8) in a plasma enhanced chemical vapor deposition apparatus, then raising the temperature, performing vacuumizing and introducing a carrier gas and a reaction gas in sequence, and finally depositing the $SiN_x$ passivation layer on the surface of the epitaxial wafer;

a step (10): repeating the step (3) to perform exposure and development at the ohmic contact electrode and the Schottky contact electrode so as to expose $SiN_x$ on the two electrodes;

a step (11): etching the exposed $SiN_x$ by using a wet etching method, and finally repeating the step (6) to remove residual photoresist and $SiN_x$ passivation layer on the surface of the epitaxial wafer of the rectifier;

a step (12): aligning by the alignment mark of the mask, and repeating the steps (3) and (4) so as to transfer a mesa isolation pattern to the surface of the epitaxial wafer and etch the groove in the surface;

a step (13): putting the epitaxial wafer of the rectifier obtained in the step (12) in a plasma-assisted chemical vapor deposition apparatus, repeating the step (8), and depositing the $SiN_x$ passivation layer in the groove etched in the step (12); and a step (14); after repeating the step (11) to remove the residual photoresist on the surface of the epitaxial wafer, removing the residual photoresist and $SiN_x$ on the surface of the epitaxial wafer of the rectifier by means of immersion in the stripping liquid for photoresist and ultrasonic cleaning so as to complete preparation of the GaN/two-dimensional AlN heterojunction rectifier on a silicon substrate.

* * * * *